United States Patent
Wang et al.

(10) Patent No.: US 11,835,784 B2
(45) Date of Patent: *Dec. 5, 2023

(54) ADJUSTABLE OPTICAL LENS AND CAMERA MODULE AND ALIGNING METHOD THEREOF

(71) Applicant: NINGBO SUNNY OPOTECH CO., LTD., Ningbo (CN)

(72) Inventors: Mingzhu Wang, Ningbo (CN); Bojie Zhao, Ningbo (CN); Liang Ding, Ningbo (CN); Chunmei Liu, Ningbo (CN); Feifan Chen, Ningbo (CN); Nan Guo, Ningbo (CN)

(73) Assignee: NINGBO SUNNY OPOTECH CO., LTD., Zhejiang Province (CN)

( * ) Notice: Subject to any disclaimer, the term of this patent is extended or adjusted under 35 U.S.C. 154(b) by 175 days.

This patent is subject to a terminal disclaimer.

(21) Appl. No.: 16/926,786

(22) Filed: Jul. 13, 2020

(65) Prior Publication Data

US 2020/0409014 A1 Dec. 31, 2020
US 2022/0342174 A9 Oct. 27, 2022

Related U.S. Application Data

(63) Continuation of application No. 15/057,054, filed on Feb. 29, 2016, now Pat. No. 10,768,391.

(30) Foreign Application Priority Data

Dec. 21, 2015 (CN) .......................... 201510968893.3

(51) Int. Cl.
G02B 7/02 (2021.01)
G02B 7/00 (2021.01)
(Continued)

(52) U.S. Cl.
CPC ............. G02B 7/003 (2013.01); G02B 7/021 (2013.01); G02B 7/025 (2013.01); G02B 27/62 (2013.01);
(Continued)

(58) Field of Classification Search
CPC .......... G02B 7/003; G02B 7/00; G02B 7/023; G02B 7/025; G02B 7/021; G02B 27/62;
(Continued)

(56) References Cited

U.S. PATENT DOCUMENTS 2,423,491 A 7/1947 Fairbank
5,781,351 A * 7/1998 Murakami ............. G02B 7/025
396/529

(Continued)

FOREIGN PATENT DOCUMENTS

CA 2 812 228 3/2012
CN 101019057 8/2007
(Continued)

Primary Examiner — Mahidere S Sahle
(74) Attorney, Agent, or Firm — Wenderoth, Lind & Ponack, L.L.P.

(57) ABSTRACT

An adjustable optical lens, a camera module and an aligning method thereof are disclosed. The adjustable optical lens includes at least one lens element and an optical structure element. Each of the lens elements is successively and overlappingly arranged in an photosensitive apparatus of the optical structure element, wherein at least one of the lens elements is configured as an adjustable lens element whose assemble position is adjustable. The optical structure element has at least one adjusting channel and at least one fixing channel for adjusting and fixing the adjustable lens element respectively.

14 Claims, 10 Drawing Sheets

(51) Int. Cl.
*H01L 27/146* (2006.01)
*H04N 23/55* (2023.01)
*H04N 23/57* (2023.01)
*G02B 27/62* (2006.01)

(52) U.S. Cl.
CPC ....... *H01L 27/14618* (2013.01); *H04N 23/55* (2023.01); *H04N 23/57* (2023.01); *G02B 7/00* (2013.01); *G02B 7/023* (2013.01)

(58) Field of Classification Search
CPC .............. G03B 5/02; G03B 2205/0023; H04N 5/2254; H04N 5/2253
USPC ....... 359/694, 703, 704, 811, 813, 819, 822, 359/823
See application file for complete search history.

(56) References Cited

U.S. PATENT DOCUMENTS

| | | | |
|---|---|---|---|
| 5,969,887 A | 10/1999 | Hagimori et al. | |
| 6,154,255 A | 11/2000 | Shishido et al. | |
| 6,344,916 B1 | 2/2002 | Chiu | |
| 6,704,151 B2 | 3/2004 | Nishimura et al. | |
| 6,928,100 B2 | 8/2005 | Sato et al. | |
| 7,929,223 B2 | 4/2011 | Shimizu et al. | |
| 8,292,524 B1 | 10/2012 | Yu | |
| 10,222,573 B2 | 3/2019 | Wang et al. | |
| 2001/0043406 A1 | 11/2001 | Mori | |
| 2003/0011902 A1 | 1/2003 | Nishimura et al. | |
| 2004/0252195 A1 | 12/2004 | Lu et al. | |
| 2005/0237415 A1 | 10/2005 | Kong et al. | |
| 2005/0270403 A1 | 12/2005 | Adachi et al. | |
| 2007/0047110 A1 | 3/2007 | Matsushima | |
| 2007/0121222 A1 | 5/2007 | Watanabe | |
| 2007/0158538 A1 | 7/2007 | Wang | |
| 2008/0112066 A1 | 5/2008 | Harada et al. | |
| 2008/0123199 A1 | 5/2008 | Hong | |
| 2009/0167880 A1 | 7/2009 | Yang et al. | |
| 2009/0316278 A1 | 12/2009 | Yen | |
| 2010/0053776 A1 | 3/2010 | Tanaka et al. | |
| 2010/0140459 A1 | 6/2010 | Tatsuzawa et al. | |
| 2010/0328789 A1 | 12/2010 | Yen | |
| 2011/0002054 A1* | 1/2011 | Lin ...................... | G02B 7/022 359/822 |
| 2011/0026144 A1 | 2/2011 | Shyu et al. | |
| 2011/0058265 A1 | 3/2011 | Chang et al. | |
| 2011/0063739 A1 | 3/2011 | Hirata et al. | |
| 2011/0069198 A1* | 3/2011 | Ezawa .................. | G02B 7/025 348/222.1 |
| 2011/0069221 A1 | 3/2011 | Yee | |
| 2011/0075021 A1 | 3/2011 | Chang | |
| 2011/0286737 A1 | 11/2011 | Kim et al. | |
| 2012/0002306 A1 | 1/2012 | Takahashi | |
| 2012/0063764 A1 | 3/2012 | Yamamoto | |
| 2012/0169885 A1 | 7/2012 | Wang et al. | |
| 2013/0063655 A1 | 3/2013 | Hsu | |
| 2013/0107381 A1 | 5/2013 | Ezawa et al. | |
| 2014/0063614 A1 | 3/2014 | Li et al. | |
| 2014/0204476 A1 | 7/2014 | Takase et al. | |
| 2014/0218813 A1 | 8/2014 | Araki et al. | |
| 2015/0172521 A1 | 6/2015 | Yasukochi et al. | |
| 2015/0244904 A1 | 8/2015 | Bone et al. | |
| 2015/0301303 A1 | 10/2015 | Kim et al. | |
| 2016/0282580 A1 | 9/2016 | Koyama et al. | |
| 2016/0349478 A1 | 12/2016 | Shirono | |
| 2017/0176705 A1 | 6/2017 | Wang et al. | |
| 2019/0137721 A1 | 5/2019 | Wang et al. | |

FOREIGN PATENT DOCUMENTS

| | | | |
|---|---|---|---|
| CN | 101609191 | 12/2009 | |
| CN | 101900862 | 12/2010 | |
| CN | 101907758 | 12/2010 | |
| CN | 101983348 | 3/2011 | |
| CN | 102486560 | 6/2012 | |
| CN | 102540636 | 7/2012 | |
| CN | 202472093 | 10/2012 | |
| CN | 103201665 | 7/2013 | |
| CN | 103874950 | 6/2014 | |
| CN | 104395805 | 3/2015 | |
| CN | 204666932 | 9/2015 | |
| CN | 105093482 | 11/2015 | |
| EP | 2 434 324 | 3/2012 | |
| JP | 3-129307 | 6/1991 | |
| JP | 2002-251769 | 9/2002 | |
| JP | 2003-195138 | 7/2003 | |
| JP | 2005-257974 | 9/2005 | |
| JP | 2007-127874 | 5/2007 | |
| JP | 2009-5328 | 1/2009 | |
| JP | 2012-141536 | 7/2012 | |
| KR | 10-2005-0103366 | 10/2005 | |
| KR | 10-2011-0060620 | 6/2011 | |
| KR | 10-2014-0069803 | 6/2014 | |
| KR | 10-2014-0076761 | 6/2014 | |
| TW | 201227164 | 7/2012 | |
| TW | 201409108 | 3/2014 | |
| WO | 2013/063014 | 5/2013 | |
| WO | 2014/162846 | 10/2014 | |
| WO | 2015/157540 | 10/2015 | |
| WO | WO-2015157540 A1 * | 10/2015 | ......... G02B 13/0015 |

* cited by examiner

ADJUSTABLE OPTICAL LENS AND CAMERA MODULE AND ALIGNING METHOD THEREOF

CROSS REFERENCE OF RELATED APPLICATION

This application is a Continuation application that claims the benefit of priority under 35U.S.C. § 120 to a non-provisional application, application Ser. No. 15/057,054, filed Feb. 29, 2016, which claims priority to Chinese application number CN20150968893.3, filed Dec. 21, 2015, which are incorporated herewith by references in their entireties.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to optical apparatus, and more particularly to adjustable optical lens, camera module and aligning method thereof.

Description of Related Arts

In the technical field of optical camera modules, as the application fields of camera are expanded and the competition in the market of the camera modules become increasingly fierce, every manufacturer is developing its technology. Therefore, camera modules with a relatively low manufacturing cost, a relatively high production efficiency, and a relatively high image quality become pursuing aims of the manufacturers, as well as key factors which play important roles in the competitive market.

The conventional camera module for mobile phone generally has a problem of image blur because of tilting during assembling or the tilt of the optical components thereof. In order to solve such problem of image blur resulted from the tilting during assembling and the tile of the optical components, a method of adjusting a lens element or a set of lens elements of the camera lens is developed by the applicant of the present invention, the adjustable components of the camera lens are adjusted in at least one direction of the horizontal direction, the vertical direction, the incline direction, and the rotating direction during assembling, so that the adjustment of an optical path of the optical lens is achieved, and finally an optical axis of the optical lens is vertical to an image sensor or a deviance thereof is within an allowable range, so that the problem of the image blur is solved. However, how to conveniently adjust the lens elements and how to permanently fix in positions of the lens elements after the adjustment so as to ensure a good image quality while still maintain an easy assembling process of the camera modules as well as a relatively low lost have become an urgent issue of the field of the camera modules.

SUMMARY OF THE PRESENT INVENTION

An object of the present invention is to provide an adjustable optical lens and camera module and an aligning method thereof, which mainly solve the problem of configuring the optical lens and its optical structure element so as to allow a lens element or a set of lens elements to be adjustable and be securely fixed in position after the adjustment.

Another object of the present invention is to provide an adjustable optical lens, a camera module and an aligning method thereof, which solve the tilting problem resulted from the optical component itself or assembling process by adjusting a lens element or a set of lens elements of the optical system of the camera module, so as to enhance a good product yielding rate of the camera module.

Another object of the present invention is to provide an adjustable optical lens, a camera module and an aligning method thereof, wherein an adjustable optical lens is provided by arranging the lens elements to be adjustable, so as to effectively avoid defective optical lens and reduce the unit price of the optical lens, so that the manufacturer is able to reduce the manufacturing cost of the camera modules and provide better competitive capability in this technical field.

Another object of the present invention is to provide an adjustable optical lens, a camera module and an aligning method thereof, wherein an adjusting channel is provided at a terminal portion of an optical structure element, wherein by vacuum suctioning the optical structure element or holding the optical structure element by a holding tool, an optical adjustment of an lens element corresponding to the terminal portion of the optical structure element can be processed, so as to increase the accuracy of the aligning process in calibration.

Another object of the present invention is to provide an adjustable optical lens, a camera module and an aligning method thereof, wherein at least one adjusting channel is provided on a top side of the optical structure element, wherein an adjusting groove is provided at the optical lens with respect to the position of the adjusting channel, so that the lens element is convenient to be reached from outside of the camera module for adjustment operation, and thus the adjusting process is easy and convenient.

Another object of the present invention is to provide an adjustable optical lens, a camera module and an aligning method thereof, wherein a lateral side of the optical structure element can be provided with at least one adjusting channel adapted for adjusting the relative position of any one or a set of the lens elements assembled in the optical structure element, so as to increase the number and range of the adjustable lens elements, so as to more precisely calibrate the optical length of the lens element(s).

Another object of the present invention is to provide an adjustable optical lens, a camera module and an aligning method thereof, wherein a position for adjusting the lens element and a position for permanently fixing the lens element in position can be configured to be the same position, and the adjusting channel can also be used to permanently fix the lens element in position after the aligning and adjusting process for calibration, so that the manufacturing cost is further reduced while the efficiency is increased.

Another object of the present invention is to provide an adjustable optical lens, a camera module and an aligning method thereof, wherein at least one fixing channel is provided in the optical structure element for permanently fixing the lens element after the adjusting process, wherein positions of the adjusting channel and the fixing channel can be different so as to increase the options and convenience of the operation.

Another object of the present invention is to provide an adjustable optical lens, a camera module and an aligning method thereof, wherein the adjusting channel communicates an interior space of the optical structure element to an outside environment, so that the lens element within the optical structure element can be adjusted from outside of the optical structure element, so as to ensure the accuracy of the adjusting process.

Another object of the present invention is to provide an adjustable optical lens, a camera module and an aligning method thereof, wherein the fixing channel communicates an interior space of the optical structure element to an outside environment, and the adjusted lens element can be permanently fixed by filling an adhesive element therein through the fixing channel.

Another object of the present invention is to provide an adjustable optical lens, a camera module and an aligning method thereof, wherein the adhesive element can be injected to a position at a top surface or a side surface of the adjustable lens element so as to permanently fix the lens element in position.

Another object of the present invention is to provide an adjustable optical lens, a camera module and an aligning method thereof, wherein the adjustable lens element can be pre-assembled at a top portion of the optical structure element, and the adjustable lens element can be adjusted at the position corresponding to an incident position of light beams at the top portion of the optical structure element, resulting an easy adjusting process.

Another object of the present invention is to provide an adjustable optical lens, a camera module and an aligning method thereof, wherein a first lens element can be configured as an adjustable lens element that can be adjusted with the aid of vacuum suction or mechanical operation, and that this adjustable lens element can also be permanently fixed in position, so that the adjusting channel and the fixing channel in the optical structure element are not required, resulting in an easier adjusting process.

Additional advantages and features of the invention will become apparent from the description which follows, and may be realized by means of the instrumentalities and combinations particular point out in the appended claims.

According to the present invention, the foregoing and other objects and advantages are attained by an adjustable optical lens which comprises one or more lens elements and an optical structure element. Each of the lens elements is successively, spacedly and overlappingly arranged in an interior space of the optical structure element, wherein at least one of the lens elements is configured as an adjustable lens element, which assemble position is adjustable. The optical structure element has at least one adjusting channel and/or at least one fixing channel for adjusting and permanently fixing the adjustable lens element in position respectively.

According to one embodiment of the present invention, the adjusting channel and the fixing channel can be the same channel, and are arranged with respect to a relative position of the adjustable lens element to communicate the interior space of the optical structure element to outside environment, wherein the adjustable lens element is able to communicate with the outside environment via the adjusting channel and/or fixing channel, and is able to be adjusted and permanently fixed in position through the adjusting and fixing channel.

According to one embodiment of the present invention, the adjusting channel and the fixing channel are different channels, and are arranged with respect to a relative position of the adjustable lens element to communicate the interior space of the optical structure element to an outside environment, wherein the adjustable lens element is able to communicate with the outside environment via the adjusting channel and the fixing channel, and is able to be adjusted and permanently fixed in position through the adjusting channel and the fixing channel.

According to one embodiment of the present invention, the adjustable lens element is the first lens element of the adjustable optical lens which is provided at a top portion of the optical structure element.

According to one embodiment of the present invention, one or more of the lens elements can be configured as the adjustable lens elements, and may be arranged in a middle portion of the optical structure element.

According to one embodiment of the present invention, the adjusting channel and the fixing channel can be both provided at a top side of the optical structure element.

According to one embodiment of the present invention, the adjusting channel and the fixing channel can be both provided at a lateral side of the optical structure element.

According to one embodiment of the present invention, the adjusting channel can be provided at a lateral side of the optical structure element while the fixing channel can be provided at a top side of the optical structure element.

According to one embodiment of the present invention, the adjusting channel can be provided at a top side of the optical structure element while the fixing channel can be provided at a lateral side of the optical structure element.

According to one embodiment of the present invention, an external adjusting tool can be inserted into the adjusting channel to contact with the adjustable lens element and adjust the assemble position of the adjustable lens element in the optical structure element along at least one direction, so as to align and calibrate a light path of the adjustable optical lens.

According to one embodiment of the present invention, the external adjusting tool may have an automatic function that is to automatically calculate an adjusting path and an adjusting quantum of the adjustable lens element. Alternatively, the external adjusting tool can be input with a desired adjusting path and a desired adjusting quantum of the adjustable lens element.

According to one embodiment of the present invention, an adhesive applying tool can be used to apply an adhesive element to an edge of the adjustable lens element, and after the adhesive is solidified, the adjusted adjustable lens element is permanently fixed in position within the optical structure element.

According to one embodiment of the present invention, the adhesive element may be applied to a terminal portion such as a top surface of the adjustable lens element to permanently fix the adjustable lens element by bonding the top surface of the adjustable lens element to an inner wall of the optical structure element.

According to one embodiment of the present invention, the adhesive element may be applied to a lateral portion such as a side surface of the adjustable lens element to permanently fix the adjustable lens element by bonding the side surface of the adjustable lens element to an inner wall of the optical structure element.

According to one embodiment of the present invention, the adjustable lens element may has at least one adjusting groove which is provided at an edge thereof, wherein an external adjusting tool, which is inserted into the optical structure element through the adjusting groove, can be retained at the adjusting groove to adjust the assemble position of the adjustable lens element in the optical structure element.

In accordance with another aspect of the invention, the present invention provides a camera module which comprises an optical sensor, and an adjustable optical lens which is provided at an optical path of the optical sensor. The adjustable optical lens comprises one or more lens elements and an optical structure element. Each of the lens elements is successively and overlappingly arranged in an photosensitive apparatus of the optical structure element, wherein at least one of the lens elements is configured as an adjustable lens element, which assemble position is adjustable. The optical structure element has at least one adjusting channel and/or at least one fixing channel for adjusting and permanently fixing the adjustable lens element in position within the optical structure element.

According to one embodiment of the present invention, in the above camera module, the adjusting channel and the fixing channel can be the same channel, and are arranged with respect to a relative position of the adjustable lens element to communicate the interior space of the optical structure element to an outside environment, wherein the adjustable lens element is able to communicate with the outside environment via the adjusting and/or fixing channel, and is able to be adjusted and permanently fixed in position within the optical structure element through the adjusting and/or fixing channel.

According to one embodiment of the present invention, in the above camera module, the adjusting channel and the fixing channel are different channels, and are arranged with respect to a relative position of the adjustable lens element to communicate the interior space of the optical structure element to an outside environment, wherein the adjustable lens element is able to communicate with the outside environment via the adjusting channel and the fixing channel, and is able to be adjusted and permanently fixed in position within the optical structure element through the adjusting channel and the fixing channel.

According to one embodiment of the present invention, in the above camera module, the adjustable lens element is a first lens element of the adjustable optical lens which is provided at a top portion of the optical structure element.

According to one embodiment of the present invention, in the above camera module, one or more of the lens elements can be configured as the adjustable lens elements, and may be arranged in a middle portion of the optical structure element.

In accordance with another aspect of the invention, the present invention provides an aligning method of a camera module which comprises the following steps.

(A) Assemble one or more lens elements in an interior space of an optical structure element and arrange each of the lens elements along an optical path of an optical sensor, wherein at least one of the lens elements is configured as an adjustable lens element to be pre-assembled in such a manner that an assemble position of the adjustable lens element is adjustable, and then the other lens elements, except the adjustable lens element, are permanently fixed in position to finish a pre-assembling process of an adjustable optical lens.

(B) Adjust the adjustable lens element through at least one adjusting channel provided in the optical structure element to make the camera module meeting a predetermined imaging and resolution requirement.

(C) Permanently fix the adjustable lens element through at least one fixing channel provided in the optical structure element to complete an alignment of the camera module for calibration.

According to one embodiment of the present invention, in the step (A), the pre-assembled adjustable optical lens is mounted with a photosensitive apparatus. Alternatively, the optical structure element is mounted with the photosensitive apparatus, and then the lens elements are installed in the optical structure element.

According to one embodiment of the present invention, the step (B) comprises the following steps: (B1) electrifying the camera module after the pre-assembling and obtaining one or more images produced by the pre-assembled camera module; (B2) computing an adjusting path and an adjusting quantum of the adjustable lens element based on the image(s) obtained; and (B3) adjusting the adjustable lens element based on the adjusting path and the adjusting quantum.

According to one embodiment of the present invention, in the step (B3), an external adjusting tool is inserted into the adjusting channel to reach the adjustable lens element to adjust the assemble position of the adjustable lens element along at least one direction, wherein after the adjusting process, a central axis of the adjusted adjustable optical lens is aligned with a central axis of the optical sensor or within a allowable range of a deviance therebetween.

According to one embodiment of the present invention, in the step (B), the external adjusting tool may have an automatic feature that is to automatically calculate the adjusting path and the adjusting quantum of the adjustable lens element. Alternatively, the external adjusting tool can be input with a desired adjusting path and a desired adjusting quantum of the adjustable lens element to quantitatively adjust the adjustable lens element.

According to one embodiment of the present invention, in the step (B), the adjustable lens element is adjusted with an aid of mechanical operation or vacuum suction.

According to one embodiment of the present invention, in the step (C), an adhesive applying tool is used to apply an adhesive element to an edge of the adjustable lens element through the fixing channel, and after the adhesive is solidified, the adjusted adjustable lens element is permanently fixed in position with respect to the optical structure element.

According to an embodiment of the present invention, in the step (C), the adhesive element may be applied to a top surface of the adjustable lens element to permanently fix the adjustable lens element in position by bonding a top surface of the adjustable lens element to an inner wall of the optical structure element.

According to an embodiment of the present invention, in the step (C), the adhesive element may be applied to a side surface of the adjustable lens element to permanently fix the adjustable lens element by bonding a side surface of the adjustable lens element to an inner wall of the optical structure element.

In accordance with another aspect of the invention, the present invention provides an aligning method of a camera module which comprises the following steps.

(a) Assemble an optical structure element with a photosensitive apparatus.

(b) Permanently fix at least one lens element in an interior space at a middle portion or a bottom portion of the optical structure element.

(c) Arrange an adjustable lens element in the interior space at an upper portion of optical structure element to achieve a pre-assembled camera module.

(d) Align the pre-assembled camera module for calibration to make the camera module meeting a predetermined imaging and resolution requirement.

(e) Permanently fix the adjustable lens element in position with respect to the optical structure element to complete an alignment of the camera module to form the camera module.

According to one embodiment of the present invention, the step (d) comprises the following steps: (d1) electrifying the pre-assembled camera module and obtaining one or more images produced by the pre-assembled camera module; (d2) computing an adjusting path and an adjusting quantum of the adjustable lens element based on the image(s) obtained; and (d3) adjusting the adjustable lens element based on the adjusting path and the adjusting quantum.

According to one embodiment of the present invention, in the above aligning method, an external adjusting tool is able to reach the adjustable lens element through a light incident channel at the top portion of the optical structure element to adjust the assemble position of the adjustable lens element along at least one direction.

According to one embodiment of the present invention, the adjustable lens element is adjusted with an aid of mechanical operation or vacuum suction.

According to one embodiment of the present invention, an adhesive element is applied to the adjustable lens element after adjustment through the light incident channel at the top portion of the optical structure element, and then after the adhesive element is solidified, the adjustable lens element is permanently fixed in position within the optical structure element.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1:
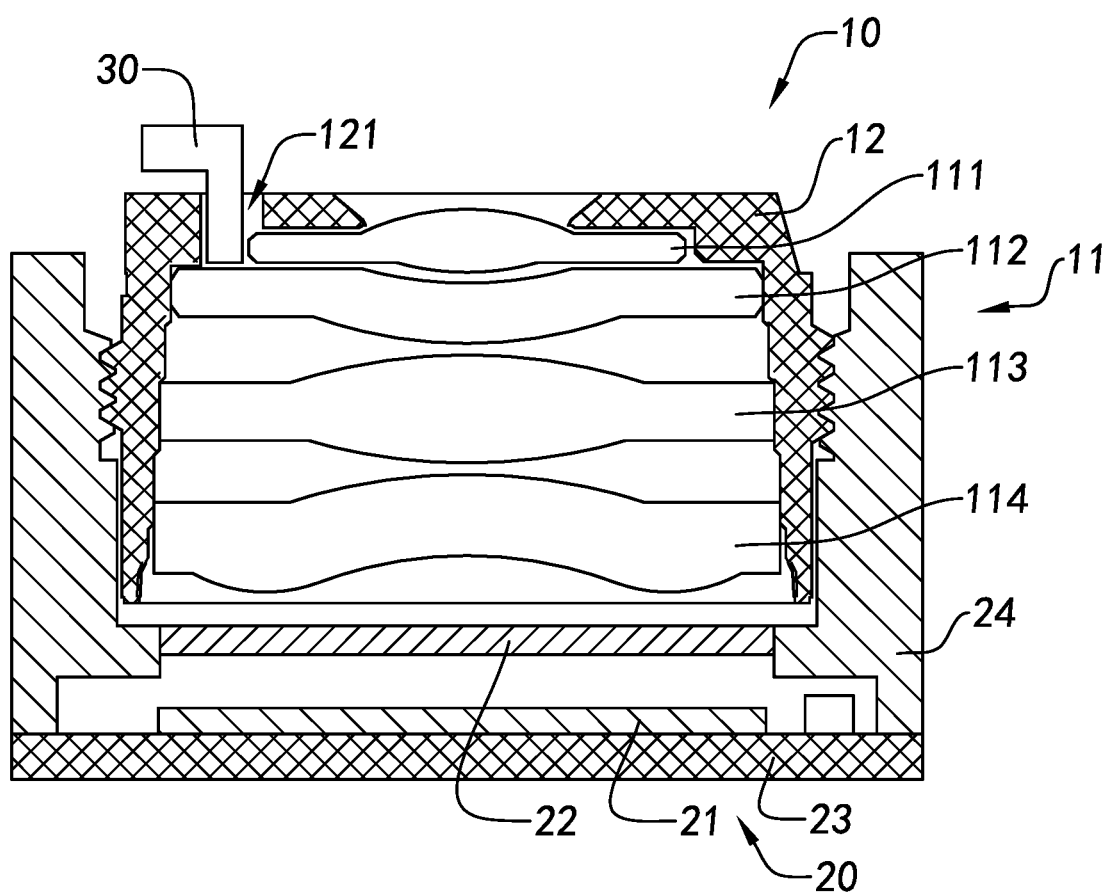
FIG. 1 is a sectional view of a camera module during an adjusting process according to a first preferred embodiment of the present invention.
Figure 2:
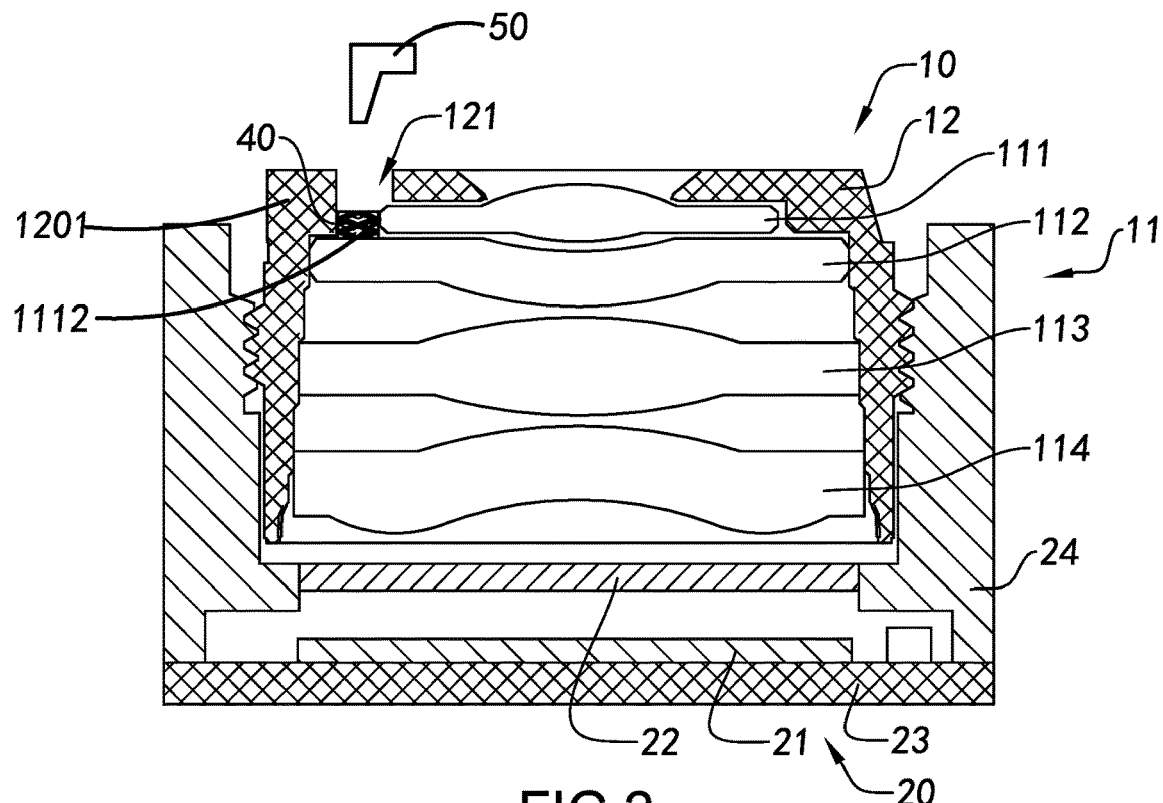
FIG. 2 is a sectional view of the camera module after the adjusting process according to the above first preferred embodiment of the present invention.

Referring to FIGS. 1 and 2 of the drawings, a camera module according to a first preferred embodiment of the present invention is illustrated. As is shown in FIGS. 1 and 2 of the drawings, the camera module comprises an adjustable optical lens 10 and a photosensitive apparatus 20 which comprises an optical sensor 21. The adjustable optical lens 10 is arranged in an optical path of the optical sensor 21 of the photosensitive apparatus 20 in such a manner that when light beams, which are reflected by an object, enter into the camera module through the adjustable optical lens 10, the light beams will then be captured by the optical sensor 21 and undergo a photoelectric conversion process, so that in a subsequent process, the camera module is able to produce a respective image of the object.

The photosensitive apparatus 20 further comprises a filter 22, a circuit board 23, and a holder 24. The filter 22 is mounted in the holder 24 at a position above the optical sensor 21, the optical sensor 21 is attached above the circuit board 23, the circuit board 23 is mounted at a bottom side of the holder 24 in such a manner that the optical sensor 21 is housed within the holder 24, and a predetermined distance is retained between the optical sensor 21 and the holder 24. In other words, the photosensitive apparatus 20 can be assembled using, for example, a COB (chip on board) process. In addition, the photosensitive apparatus 20 can also be assembled using other processes such a flip chip process. In other words, the photosensitive apparatus 20 can be assembled using any suitable process according to actual requirements.

The adjustable optical lens 10 comprises one or more lens elements 11 and an optical structure element 12, the lens elements 11 are arranged in the optical structure element 12 along a height direction of the optical structure element 12, and at least one of the lens elements is arranged as an adjustable lens element and an assemble position of the adjustable lens element is arranged to adjustable within the optical structure element 12, so that an optical path of the adjustable optical lens 10 is able to be adjusted for an optical quantum, until a central axis of the adjustable optical lens 10 is aligned with a central axis of the optical sensor 21 or within an allowable range of a deviance between the central axes of the adjusted adjustable optical lens 10 and the optical sensor 21, so as to ensure an image quality of the camera module.

It is worth mentioning that the optical structure element 12 can be a common lens barrel, or an integral structure which comprises a lens barrel and a holder integrated with the lens barrel. The camera module can be further embodied as a product with an Auto-Focus arrangement, or the lens barrel of the camera module may be integrated with a carrier of the Auto-Focus arrangement.

According to the preferred embodiment, the adjustable optical lens 10 is embodied to comprise four lens elements 11, including a first lens element 111, a second lens element 112, a third lens element 113, and a fourth lens element 114, wherein the four lens elements are successively and overlappingly arranged in the optical structure element 12 in such a manner that the first lens element 111 is arranged in an upper portion 1201 of the optical structure element 12 to arranged as adjustable lens element 111. According, the adjustable lens element 111 (the first lens element 111 in the preferred embodiment) is pre-assembled in the optical structure element 12, while the assemble position of the adjustable lens element can be adjusted along at least one direction, such as one or more directions of a horizontal direction, a vertical direction, an incline direction, a peripheral direction and etc.

In addition, at least one adjusting channel 121 is provided at the upper portion such as a top side of the optical structure element 12 for communicating an interior space of the optical structure element 12 to outside environment. A position of the adjusting channel 121 is provided with respect to a relative position of the adjustable lens element 111 so that the adjustable lens element 111 can be intentionally adjusted from outside of the optical structure element 12.

More specifically, an external adjusting tool 30 as shown in FIG. 1 can be inserted into the adjusting channel 121 to reach the adjustable lens element 111, and since a gap can be remained between a side surface of the adjustable lens element 111 and an inner wall of the optical structure element 12, the external adjusting tool 30 is able to reach and contact with the side surface of the adjustable lens element so as to adjust the assemble position of the adjustable lens element 111. For example, the external adjusting tool 30 in this preferred embodiment can be embodied as a probe which can be inserted into the adjusting channel 121 to reach the side surface of the adjustable lens element 111 to adjust the assemble position of the adjustable lens element 111. The external adjusting tool 30 can be embodied as a probe installed with electronic components for performing some automatic functions, such as automatically computing an adjusting path and an adjusting quantum of the adjustable lens element 111, i.e. the amount of the adjustable lens element 111 to be adjusted, with respect to the photosensitive apparatus 20, so as to facilitate a quantitative judgment of the adjustment. Alternatively, the probe 30 may be intelligently input with a predetermined adjusting path and an adjusting quantum for precisely and quantitatively adjust the adjustable lens element 111.

It is worth mentioning that the adjusting path and the adjusting quantum of the adjustable lens element 111 can be obtained in the following described process. Accordingly, when the pre-assembled camera module is electrified, one or more images captured by the pre-assembled camera are obtained and analyzed to calculate the adjusting path and the adjusting quantum of the adjustable lens element 111 via a calibration software in order to intentionally adjust the adjustable lens element 111. Accordingly, few times of adjustment process, may be few as just one single adjustment process can achieve the desired requirement, so that the aligning speed is fast, the adjusting time is saved, and the efficiency and the yield rate of the manufacturing process are increased.

A permanently fixing process is further required for completing the aligning and assembling process of the camera module after adjusting the assemble position of the adjustable lens element 111. According to the preferred embodiment, the permanent fixing process can be embodied as a process using an external fixing tool to fix the adjustable lens element 111 in position. For example, an adhesive applying device 50 according to this preferred embodiment is used to apply an adhesive element to permanently fix the first lens element 111 in position within the optical structure element 11. In other words, the adhesive applying device 50 applies an adhesive element 40 into the adjusting channel 121, which is also embodied as the fixing channel in this preferred embodiment, and then the adhesive element 40 is solidified to permanently fix the lens element 111 in position. According to this preferred embodiment, the adhesive element 40 can be embodied as a thermosetting adhesive.

It is worth mentioning that, as is shown in FIG. 2, the adhesive element 40 is applied to a lateral portion such as a side surface 1112 of the first lens element 111. In other words, the adhesive element 40 is applied between the side surface 1112 of the first lens element 111 and the inner wall of the optical structure element 12, so as to permanently fix the first lens element 111 in position by bonding and connecting the side surface 1112 of the first lens element 111 to the inner wall of the optical structure element 12.

When applying the adhesive element 40, the adhesive element 40 can be filled into the adjusting channel 121 (fixing channel) so as to seal the adjusting channel 121 during the operation for permanently fixing the adjustable lens element 111 in position. Alternatively, the adjusting channel 121 can be sealed by an additional quantum of the adhesive element after the adjustable lens element 111 is permanently fixed by the adhesive element 40.

Furthermore, when the side surface 1112 of the adjustable lens element 111 is extended to be adjacent to the inner side wall of the optical structure element 12, the adhesive element 40 can be applied to a top portion such as top surface of the adjustable lens element 111, so as to permanently fix the adjustable lens element 111 in position by bonding the top surface of the adjustable lens element to the inner wall of the optical structure element 12.

Figure 3:
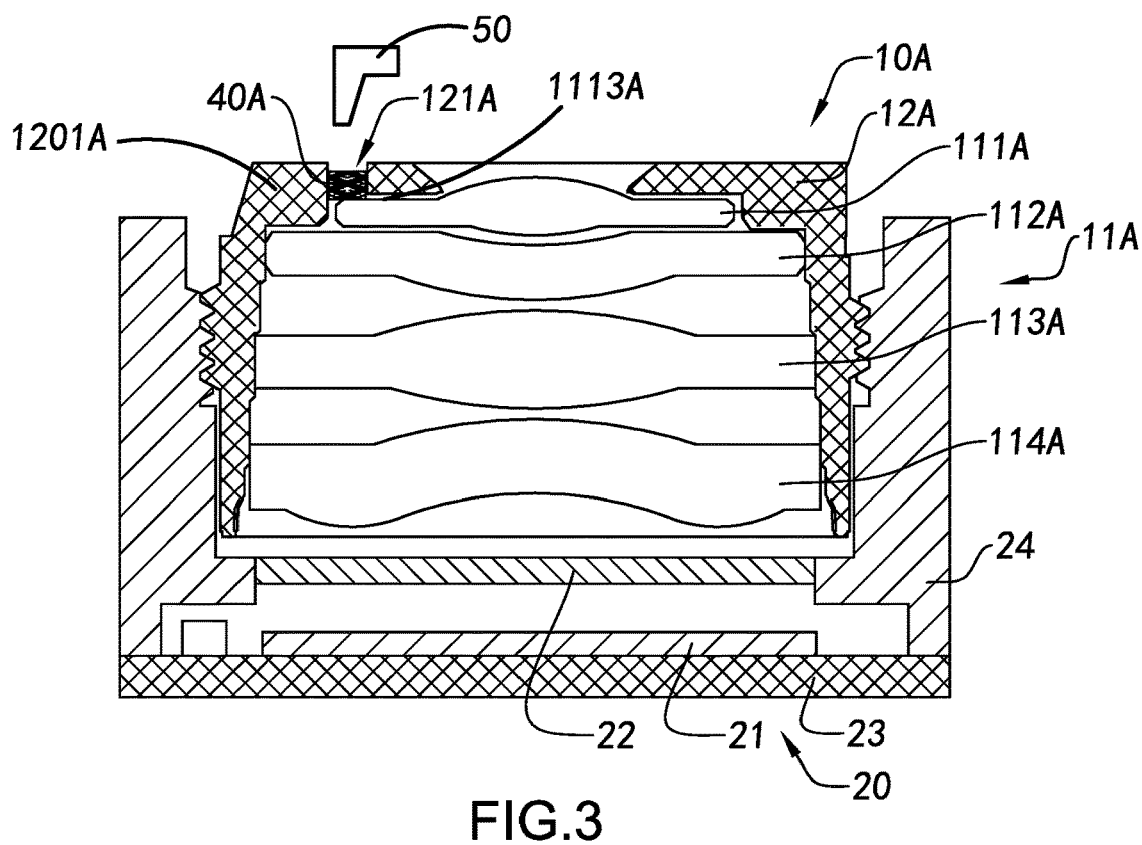
FIG. 3 is a sectional view of the camera module after the adjusting process according to an alternative mode of the above first preferred embodiment of the present invention.

More specifically, as shown in FIG. 3, an adjustable optical lens 10A is an alternative mode of the above adjustable optical lens 10. Accordingly, the adjustable optical lens 10A is configured to comprise one or more lens elements 11A and an optical structure element 12A. More specifically, the set of lens elements 11A comprises four lens elements, including a first lens element 111A, a second lens element 112A, a third lens element 113A, and a fourth lens element 114A, wherein the four lens elements 111A, 112A, 113A and 114A are successively and overlappingly arranged in the optical structure element 12A in such a manner that the first lens element 111A is arranged in an upper portion 1201A of the optical structure element 12A to arranged as an adjustable lens element 111A which can be adjusted through at least one adjusting channel 121A which is provided at the top side of the optical structure element 12A. Accordingly, the external adjusting tool 30 can be used to reach and contact a top surface 1113A of the first lens element 111A through the adjusting channel 121A to adjust an assemble position of the first lens element 111A. After the adjusting process, the adjusting channel 121A, which also can be embodied as a fixing channel in this preferred embodiment, is filled with the adhesive element 40A to permanently fix the first lens element 111A. Accordingly, the adhesive element 40A can be applied to the top surface 1113A of the first lens element 11A at a position with respect to the adjusting channel 11A, so that the top surface 1113A of the first lens element 111A and the inner wall of the optical structure element 12A are bonded and connected by the adhesive element 40A. In addition, when applying the adhesive element 40A, the adjusting channel 121A is preferred to be fully filled with the adhesive element 40A, so that the adjusting channel 40A is simultaneously sealed when the adjustable lens element 111A is permanently fixed in position, so as to keep off from dust and reduce manufacturing procedures, save manufacturing time, and increase manufacturing efficiency.

Figure 4:
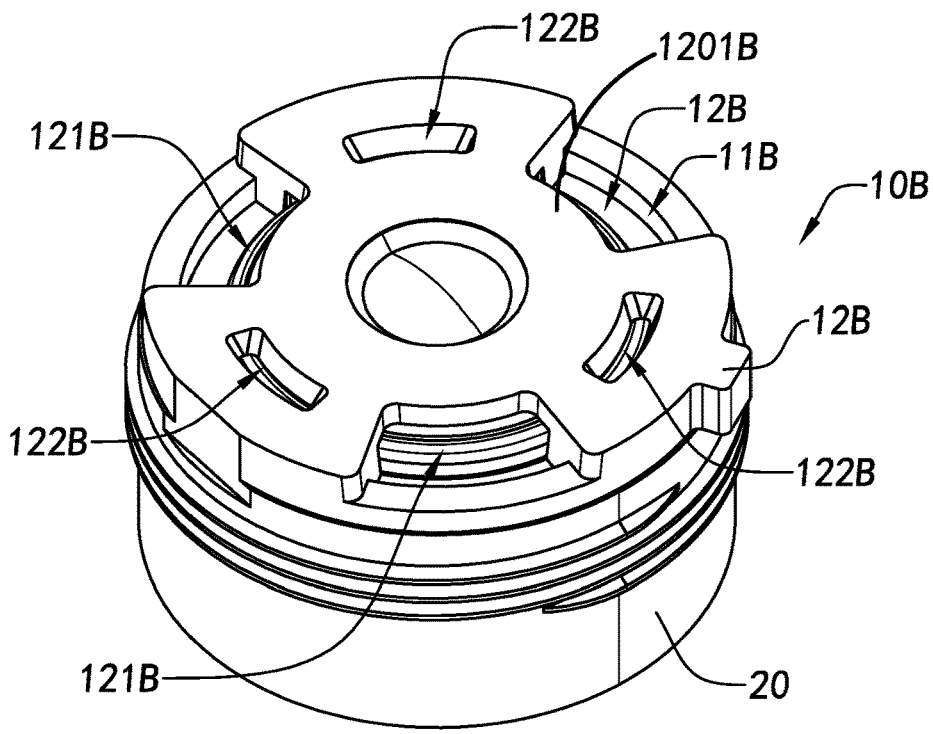
FIG. 4 is a perspective view of a camera module according to a second preferred embodiment of the present invention.
Figure 5:
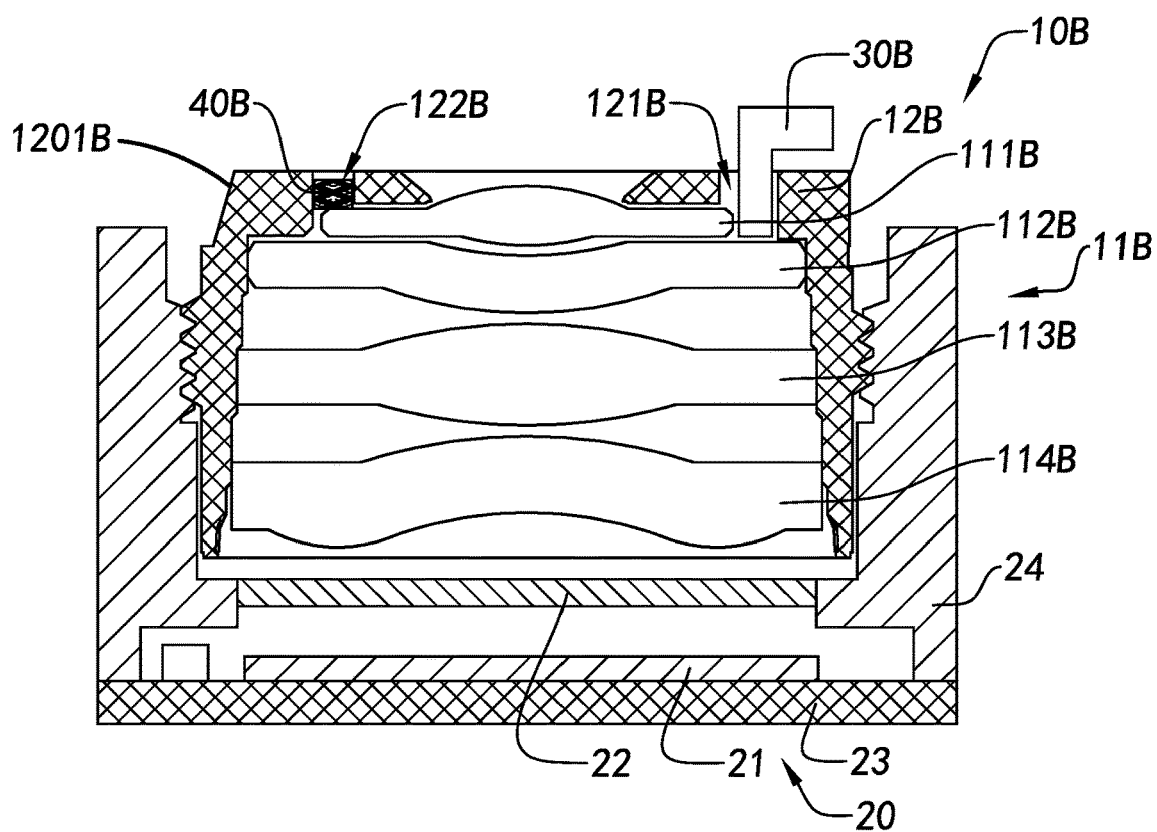
FIG. 5 is a sectional view of the camera module according to the above second preferred embodiment of the present invention.

Referring to FIGS. 4 and 5 of the drawings, a camera module according to a second preferred embodiment of the present invention is illustrated. As shown in the drawings, of FIGS. 4 and 5, the camera module comprises an adjustable optical lens 10B and a photosensitive apparatus 20. The adjustable optical lens 10B is arranged and permanently fixed on top of the photosensitive apparatus 20 while meeting the requirement of an optical path and the requirement of an image quality of the camera module. According to the second embodiment, the photosensitive apparatus 20 can be constructed to have the same structure as the photosensitive apparatus 20 as described in the above first preferred embodiment.

The adjustable optical lens 10B is configured to comprise one or more lens elements 11B and an optical structure element 12B. The set of lens elements 11B includes, according to this embodiment, a first lens element 111B, a second lens element 112B, a third lens element 113B, and a fourth lens element 114B, wherein the four lens elements 111B, 112B, 113B, and 114B, are successively arranged in the optical structure element 12B along an optical path of an optical sensor 21 of the photosensitive apparatus 20 in such a manner that the first lens element 111B is arranged in an upper portion 1201B of the optical structure element 12B to be arranged as an adjustable lens element 111B that can be pre-assembled within the optical structure element 12B and configured to be adjustable along at least one direction.

At least one adjusting channel 121B is provided in a lateral portion, embodied as a side surface, of the optical structure element 12B, at a position with respect to a position of the adjustable lens element 111B for communicating an interior space of the optical structure element 12B to outside environment, so as to facilitate the adjusting process of the adjustable lens element 111B.

According to this preferred embodiment, there is a plurality of, such as three, adjusting channels 121B provided in the top side of optical structure element 12B at positions corresponding to the first lens element 111B. The three adjusting channels 121B can be arranged along a circumferential direction with an interval of 120° C., so as to adjust the first lens element 111B along multiple directions and angles, such that the accuracy of the adjusting process is ensured. More specifically, since a peripheral edge of the first lens element 111B is accessible through any of the adjusting channels 121B, an external adjusting tool 30B can be inserted into one of the adjusting channels 121B to reach and contact with the peripheral edge of the first lens element 111B, so as to adjust the assemble position of the first lens element 111B.

The optical structure element 12B further has at least one, such as three, fixing channels 122B provided in the upper portion thereof, along a circumferential direction, for communicating the interior space of the optical structure element 12B to the outside environment, so that an adhesive element 40B and be injected and applied to the adjustable lens element 111B and the optical structure element 12B through the fixing channels 122B to permanently fix the adjustable lens element 111B in position. According to this preferred embodiment, the adhesive element 40B can be applied to a surface of the adjustable lens element 111B and then be solidified to permanently fix the adjustable lens element 111B in position with respect to the optical structure element 12B. Accordingly, the three fixing channels 122B are arranged with an interval of 120° C. between each other, and spacedly arranged with the adjacent adjusting channels 121B respectively, so that the adjustable lens element 111B can be permanently fixed in position through multiple positions of the fixing channels 122B, so that the permanently fixing stability of the adjustable lens element 111B as well as the operation reliability of the camera module can be ensured.

Figure 6:
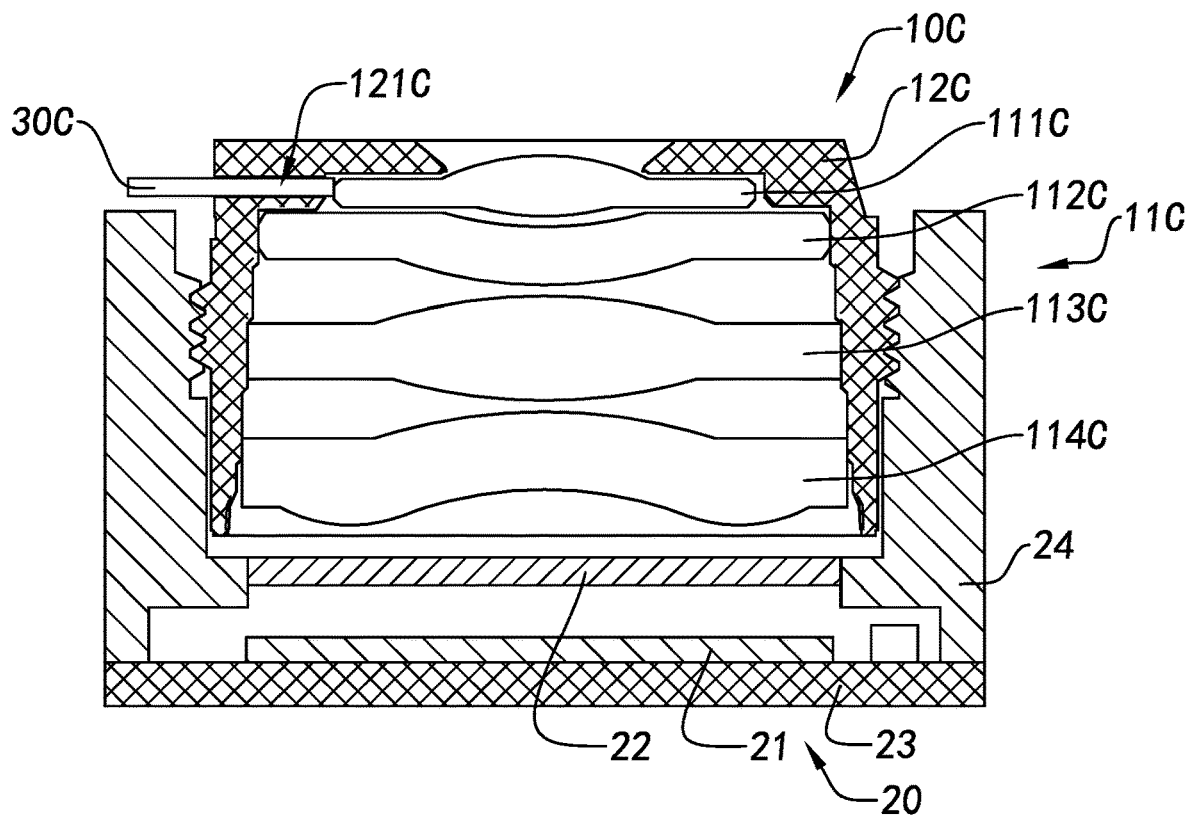
FIG. 6 is a sectional view of a camera module according to a third preferred embodiment of the present invention.

Referring to FIG. 6 of the drawings, a camera module according to a third preferred embodiment of the present invention is illustrated. As shown in FIG. 6 of the drawings, the camera module comprises an adjustable optical lens 10C and a photosensitive apparatus 20. According to this third embodiment, the photosensitive apparatus 20 can be constructed to have the same structure as the photosensitive apparatus 20 described in the above first preferred embodiment.

The adjustable optical lens 10C is configured to comprise a set of lens elements 11C and an optical structure element 12C. The set of lens elements 11C includes a first lens element 111C, a second lens element 112C, a third lens element 113C, and a fourth lens element 114C, wherein the four lens elements 111C, 112C, 113C, and 114C are successively arranged in the optical structure element 12C along an optical path of an optical sensor 21 of the photosensitive apparatus 20 in such a manner that the first lens element 111C is arranged in an upper portion of the optical structure element 12C to arrange and function as an adjustable lens element 111C which can be pre-assembled within the optical structure element 12C and configured to be adjustable along at least one direction.

At least one adjusting channel 121C is provided in a lateral portion such as a side surface of the optical structure element 12C, at a position corresponding to a position of the adjustable lens element 111C for communicating an interior space of the optical structure element 12C to an outside environment, so as to facilitate the adjusting process of the adjustable lens element 111C.

According to this preferred embodiment, there is a plurality of, such as three, adjusting channels 121C provided in the upper portion such as the top side of optical structure element 12C, at positions corresponding to the first lens element 111C. The three adjusting channels 121C can be arranged along a circumferential direction with an interval of 120° C., so as to enable the first lens element 111C to be adjusted along multiple directions and angles, so that the accuracy of the adjusting process is ensured. More specifically, since a peripheral edge of the first lens element 111C is accessible through any of the adjusting channels 121C, an external adjusting tool 30C can be inserted through one of the adjusting channels 121C to reach and contact with the peripheral edge of the first lens element 111C to adjust the assemble position of the first lens element 111C.

Accordingly, the portion of the optical structure element 12C, which is formed with the adjusting channels 121C, is higher than the holder 24. In other words, the adjusting channels 121C are provided at the portion of the optical structure element 12C which is protruded from the holder 24, so that the adjustable lens element can be adjusted through the outside of the optical structure element 12C, and thus a block of the holder 24 can be prevented.

After the adjusting process, an adhesive applying tool 30C can be used to fill the adhesive element into the adjusting channel 121C that can also be functioned as the fixing channel in this preferred embodiment, wherein the adhesive element injected and contacted with the first lens element 111C permanently fixes the first lens element 111C in position with respect to the optical structure element 12C.

Preferably, an additional quantum of the adhesive element can be applied to simultaneously seal the adjusting channel 121C after permanently fixing the first lens element 111C in position within the optical structure element 12C.

Figure 7:
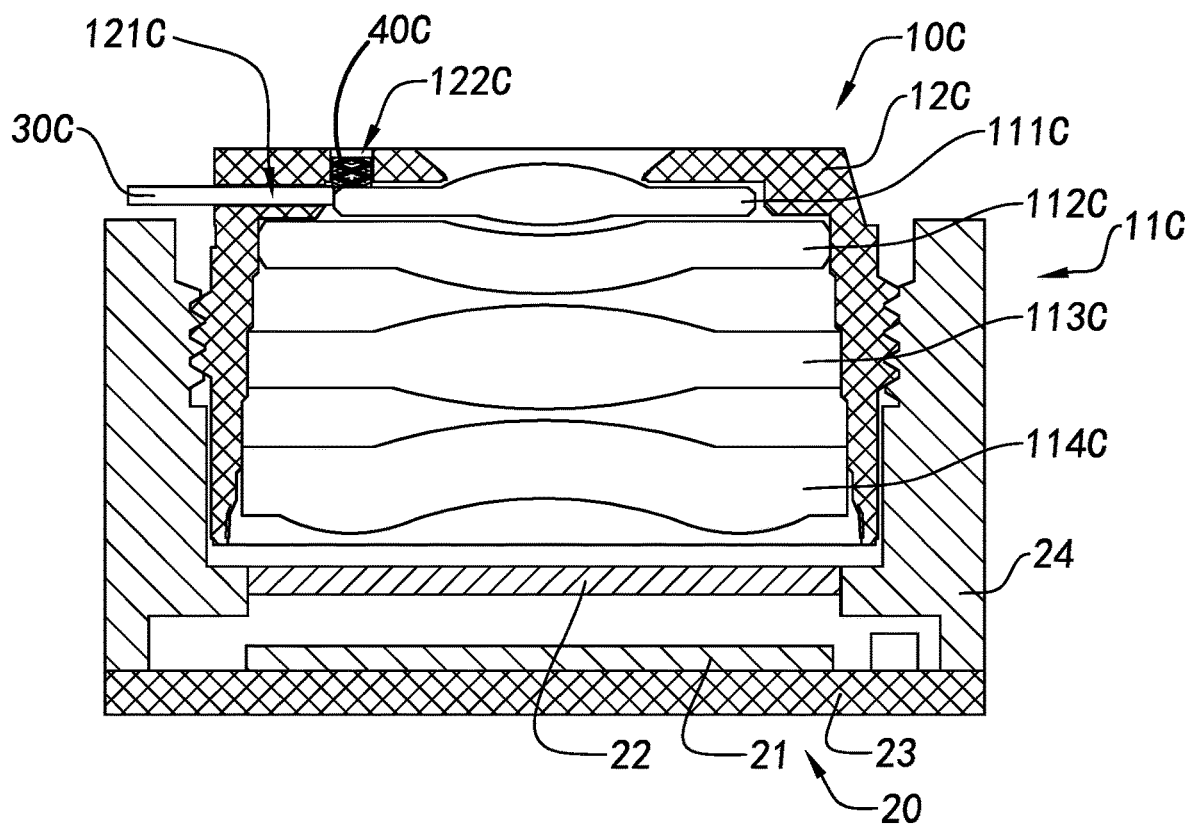
FIG. 7 is a sectional view of the camera module according to a first alternative mode of the above third preferred embodiment of the present invention.

FIG. 7 illustrates an alternative mode of the above third preferred embodiment of the present invention. According to this alternative mode, a fixing channel 122C is provided at a top side of the optical structure element 12C for permanently fixing the first lens element 111C. More specifically, the adhesive element 40C can be injected into the optical structure element 12C through the fixing channel 122C, after a solidifying procedure, a surface such a top surface of the first lens element 111C is bonded with the adhesive element 40C to permanently fix the first lens element 111C with the optical structure element 12C, wherein the fixing channel 122C, which communicates the surface of the first lens element 111C to the outside environment of the optical structure element 12C, can also be filled with the adhesive element 40C for sealing the fixing channel 122C.

It is worth mentioning that both of the adjusting channel 121C and the fixing channel 122C can be used simultaneously for permanently fixing the first lens element 111C in position.

Figure 8:
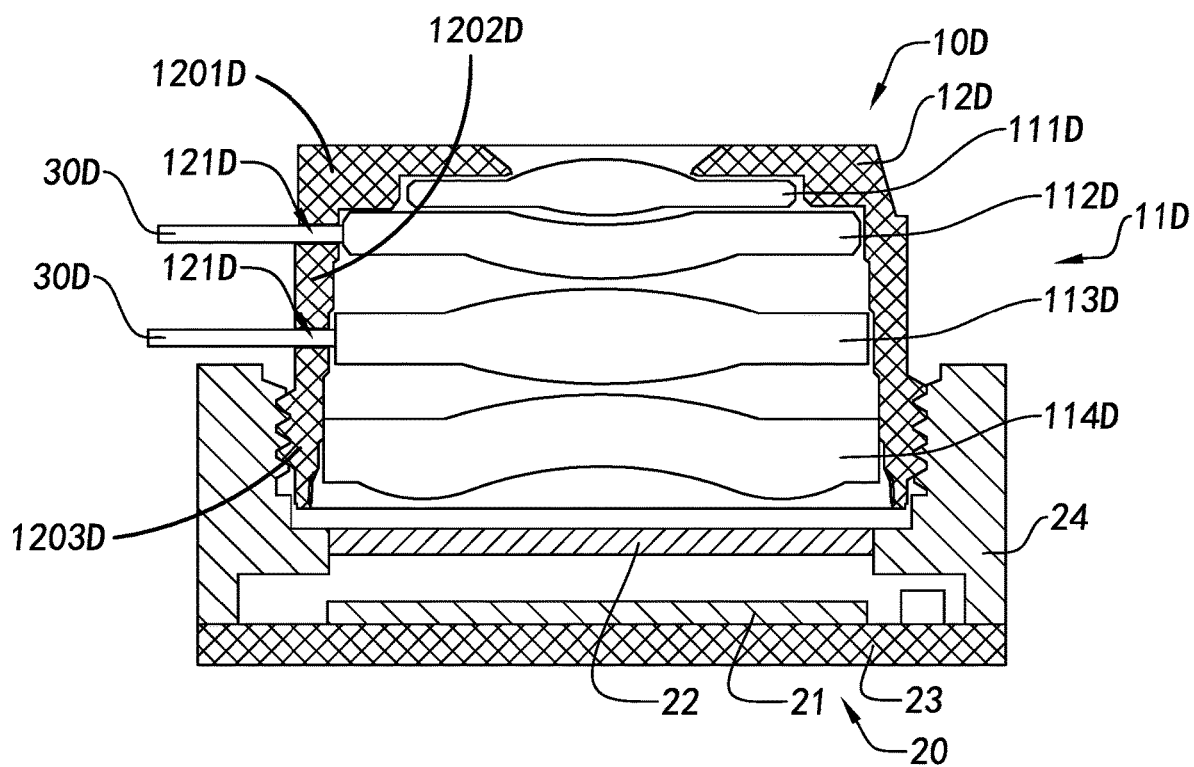
FIG. 8 is a sectional view of the camera module according to a second alternative mode of the above third preferred embodiment of the present invention.

FIG. 8 illustrates another alternative mode of the above third preferred embodiment of the present invention. As shown in FIG. 8 of the drawings, the camera module comprises an adjustable optical lens 10D and a photosensitive apparatus 20 which is embodied to have the same structure as the photosensitive apparatus 210 as described in the above first preferred embodiment.

The adjustable optical lens 10D is provided along an optical path of the photosensitive apparatus 20. The adjustable optical lens 10D is configured to comprise one or more lens elements 11D and an optical structure element 12D, wherein the set of lens elements 11D is installed in the optical structure element 12D along a height from a top portion 1201D, to a middle portion 1202D and a bottom portion 1203D thereof. The set of lens elements 11D in this preferred embodiment includes a first lens element 111D, a second lens element 112D, a third lens element 113D, and a fourth lens element 114D. The first lens element 111D and the fourth lens element 1114D are permanently fixed in position within the optical structure element 12D, and the second lens element 112D and the third lens element 113D are pre-assembled in the optical structure element 12D to be arranged as adjustable lens elements 112D and 113D. Accordingly, the adjustable lens elements are provided in the middle portion 1202D of the optical structure element 12D, and their assemble positions can each be adjusted along at least one direction. It is worth mentioning that the position of the middle portion 1202D of the optical structure element 12D for arranging the adjustable lens elements can be a position other than the positions for arranging the first lens element 111D and the fourth lens element 1114D. In other words, the position of the middle portion of the optical structure element 12D for arranging the adjustable lens elements 112C, 113D, can be not interpreted as a central portion of the optical structure element 12D, but can be any position except the top and bottom portions 1201D, 1203D of the optical structure element 12D.

The optical structure element 12D further has at least one adjusting channel 121D provided corresponding to the relative positions of the second and third lens elements 112D and 113D. The adjusting channels 121D communicate an interior space of the optical structure element 12D to outside environment, so that one or more external adjusting tools 30D can be respectively inserted into the adjusting channels 121D to reach and contact peripheries of the second and third lens elements 112D and 113D to adjust the assemble positions of the second and third lens elements 112D and 113D.

Each of the external adjusting tools 30D can be embodied as a probe installed with electronic components for performing some automatic functions, such as automatically calculating an adjusting path and an adjusting quantum of the adjustable lens element, so as to facilitate a quantitative judgment of the adjustment. Alternatively, the probe may be intelligently input with a predetermined adjusting path and an adjusting quantum for precisely and quantitatively adjust the adjustable lens element, so as to increase the adjusting efficiency.

According to this preferred embodiment, a plurality of adjusting channels 121D may be provide along a lateral portion of optical structure element 12D. The plurality of adjusting channels 121D can be arranged circumferentially to align with the corresponding adjustable lens elements 112D, 113D, so that each of the adjustable lens elements 112D, 113D can be adjusted along multiple directions, so as to ensure the adjusting accuracy. For example, three adjusting channels 121D can be arranged circumferentially around the second lens element 112D, and there adjusting channels 121D can be arranged circumferentially around the third lens element 113D.

After adjusting the assemble positions of the second and third lens elements 112D and 113D, the adjusting channels 121D can be used as the fixing channels to permanently fix the second and third lens elements 112D and 113D in positions within the optical structure element 12D. For example, an adhesive applying tool 30D can be used to apply the adhesive element through the adjusting channels 121D, the adhesive element reached and contacted the peripheries of the second and third lens elements 112D and 113D permanently fixes the second and third lens elements 112D and 113D to the inner wall of the optical structure element 12D. At the same time, the adhesive element also can be used to fill and seal the adjusting channels 121D. Accordingly, the adhesive element may be embodied as thermosetting adhesives, and after heat treatment, the solidified adhesives can permanently fix the second and third lens elements 112D and 113D and simultaneously seal the adjusting channels 12D.

In view of the above embodiments, it is worth mentioning that the adjustable lens element can be pre-assembled and an adhesive element in a semi-solidifying state is used, and then in the following permanently fixing procedure, the adhesive element is completely cured and solidified, so as to permanently fix the adjustable lens element. And then, additional adhesive can be applied to seal the adjusting channel, or additional adhesive can be applied to further secure the adjustable lens element, so as to ensure the permanently fixing reliability.

In addition, it is even worth mentioning that the adjusting positions and fixing positions for the adjustable lens element can be same positions or different positions. For example, the optical structure element, for example 12D, can be provided with a plurality of fixing channels at a lateral side thereof corresponding to positions of the adjustable lens elements. The fixing channels and the adjusting channels can be spacedly arranged at the lateral side of the optical structure element, so that the adjustable lens elements can be adjusted and permanently fixed through different directions. Alternatively, a portion of the optical structure element may be formed with the adjusting channels, while another portion of the optical structure element may be formed with the fixing channels.

Figure 9:
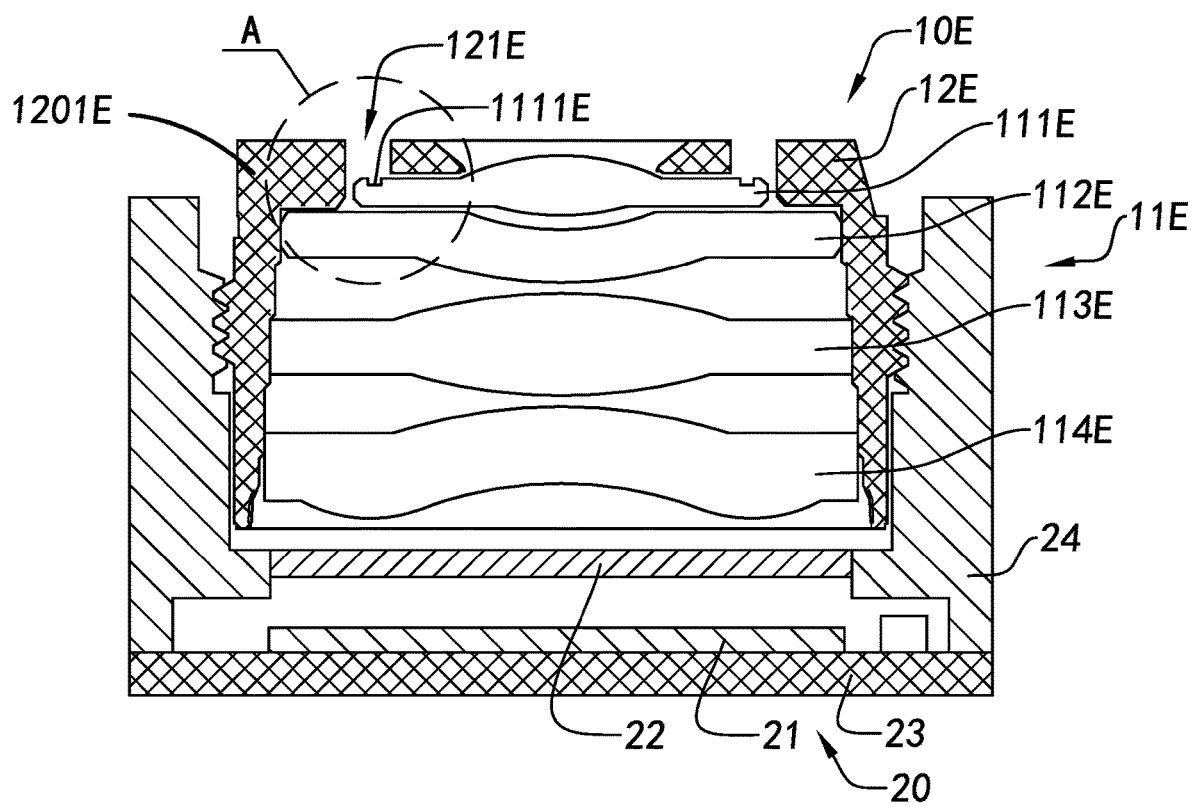
FIG. 9 is a sectional view of a camera module according to a fourth preferred embodiment of the present invention.
Figure 10:
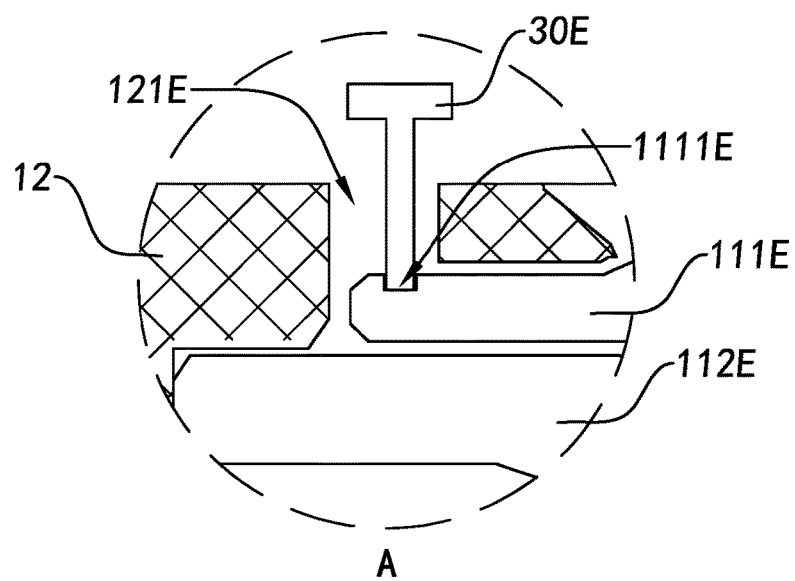
FIG. 10 is a partial enlarged view of the camera module according to the above fourth preferred embodiment of the present invention.

Referring to FIGS. 9 and 10, a camera module according to a fourth preferred embodiment of the present invention is illustrated. As shown in FIGS. 9 and 10 of the drawings, the camera module comprises an adjustable optical lens 10E and a photosensitive apparatus 20, wherein the photosensitive apparatus 20 can be constructed to have the same structure as the photosensitive apparatus 20 as described in the above first preferred embodiment. The adjustable optical lens 10E is provided in an optical path of the photosensitive apparatus 20, so that the camera module is able to shoot pictures and provide images.

The adjustable optical lens 10E is configured to comprise one or more lens elements 11E and an optical structure element 12E, wherein each of the lens elements 11E is arranged in the optical structure element 12E along a height thereof in an optical path of an optical sensor 21 of the photosensitive apparatus 20.

The set of lens elements 11E in this preferred embodiment is embodied to include a first lens element 111E, a second lens element 112E, a third lens element 113E, and a fourth lens element 114E. The four lens elements 111E, 112E, 113E, and 114E are installed in the optical structure element 12E from a top portion to a bottom portion thereof. The first lens element 111E is provided at the top portion of the optical structure element 12E, and is pre-assembled in the optical structure element 12E to arrange and function as an adjustable lens element 111E that can be adjusted along at least one direction, so that an optical length of the adjustable optical lens 10E is adjustable, so that a central axis of the adjustable optical lens 10E is overlappingly aligned with a central axis of the optical sensor 21, or within an allowable range of a deviance thereof.

The optical structure element 12E provides at least one adjusting channel 121E at a top portion thereof for communicating an interior space of the optical structure element 12E to an outside environment, so that a top portion of the first lens element 111E can be communicated to outside through the adjusting channel 121E, so as to facilitate the adjusting process of the assemble position of the first lens element 111E.

The first lens element 111E provides at least one adjusting groove therein, embodying two adjusting grooves 1111E. According to this preferred embodiment, the two adjusting grooves 1111E are formed at a top surface of the first lens element 111E, and openings of the two adjusting grooves 1111E are respectively aligned with the two adjusting channels 121E, while the two adjusting grooves 1111E communicating to the outside environment via the adjusting channels 121E. Preferably, each of the adjusting grooves 1111E is provided at a position adjacent to an edge of the first lens element 111E, so that the light transmitting function of the first lens element 111E is not influenced, and the imaging performance of the camera module is ensured.

When adjusting the assemble positions of the first lens element 111E, at least one external adjusting tool 30E can be inserted through the adjusting channel 121E to reach the first lens element 111E. Accordingly, a tip of the external adjusting tool 30E can be inserted through the adjusting groove 1111E to hold the first lens element 111E via the adjusting groove 1111E, and the first lens element 111E is adjusted along at least one direction, including a horizontal direction, a vertical direction, an incline direction, and/or a peripheral direction, to adjust the optical path of the adjustable lens element 10E, so as to ensure the camera module meeting the imaging and resolution requirement.

After the adjusting process of the first lens element 111E, a fixing process can be applied to finish the assembly of the adjustable optical lens 10E. According to this preferred embodiment, the fixing channel and the adjusting channel can be the same channel, i.e. the adjusting channel 121E of this preferred embodiment is also used as a fixing channel. More specifically, an adhesive applying tool can be used to fill the adhesive element into the adjusting channel 121E, wherein the adhesive element, which may be in a form of liquid or in a form of a semi-solidifying form, can flow to a position at a top surface or a side surface of the first lens element 111E, and thus when the adhesive element is solidified, the first lens element 111E is permanently fixed in the optical structure element 12E. In addition, additional adhesive can be applied so as to seal the adjusting channel 121E.

It is worth mentioning that the number of the adjusting channels 121E and the number of the adjusting grooves 1111E can be arbitrary and not limited. Additional fixing channel(s) also can be provided to permanently fix the adjustable lens element, and the positions of the fixing channels and the adjusting channels can be different.

Figure 14:
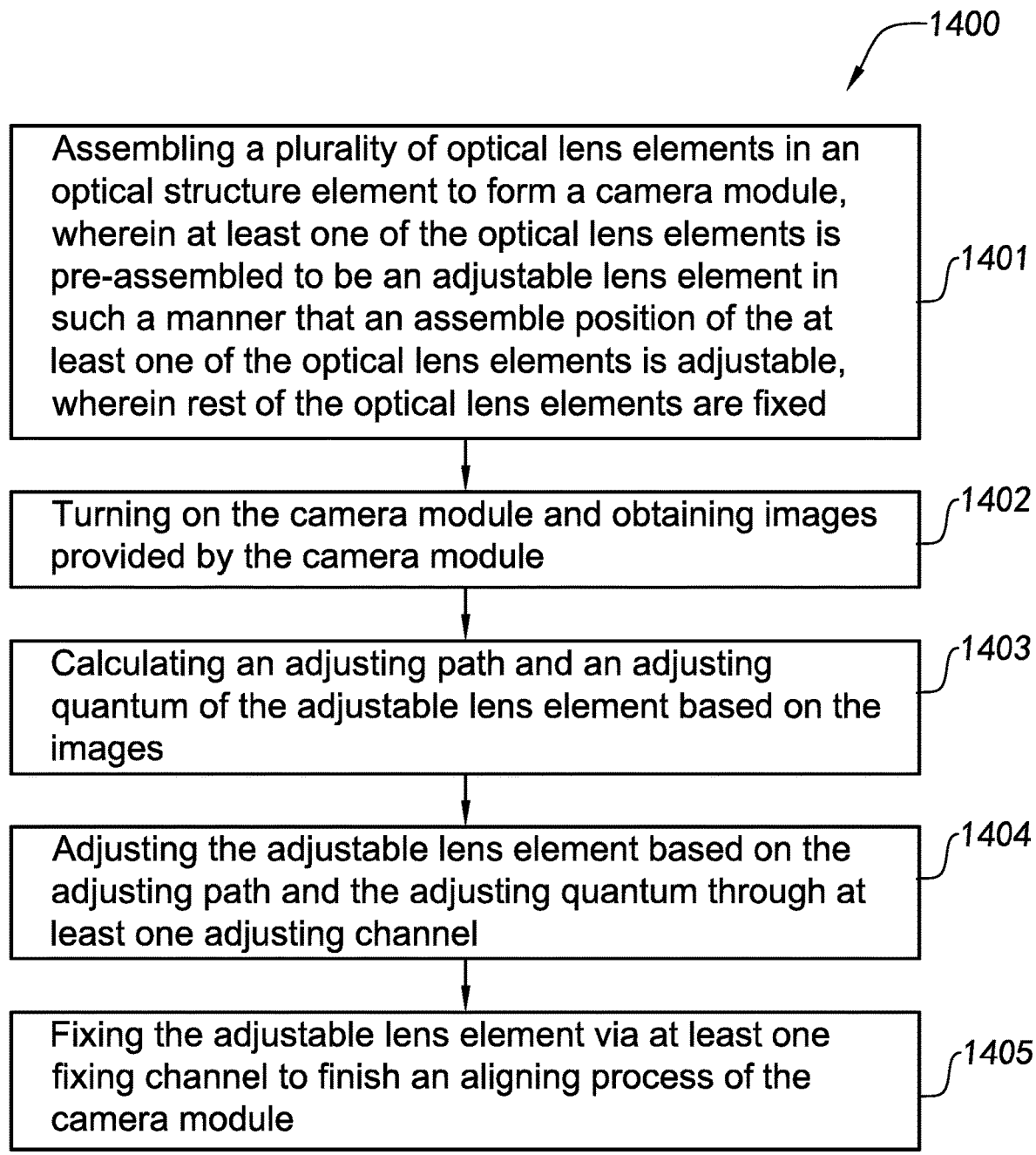
FIG. 14 is a flow chart illustrating the aligning method of the camera module according to the above first to fourth preferred embodiments of the present invention.

Referring to FIG. 14, the aligning method of the camera module according to the fourth preferred embodiment of the present invention is illustrated, wherein the aligning method 1400 of the camera module comprises the following steps.

S1401: Assembling a plurality of lens elements in an optical structure element to form a camera module, wherein at least one of the lens elements is pre-assembled and arranged to be an adjustable lens element in such a manner that an assemble position of the at least one of the lens elements is adjustable, while the other lens elements are permanently fixed in position within the optical structure element.

S1402: Electrifying the camera module and obtaining images produced by the camera module.

S1403: Computing an adjusting path and an adjusting quantum of the adjustable lens element based on the images obtained.

S1404: Adjusting the adjustable lens element based on the adjusting path and the adjusting quantum through at least one adjusting channel.

S1405: Permanently fixing the adjustable lens element in position within the optical structure element via at least one fixing channel to finish an aligning process for calibration of the camera module.

Accordingly, in the step of S1401, one or more lens elements can be chosen as the adjustable lens elements which are not permanently fixed (merely pre-assembled) so as to facilitate the subsequent adjusting process.

In the step of S1404, an external adjusting tool can be used to adjust the adjustable lens element through the adjusting channel of the optical structure element. The adjusting channel can be provided at a top or a side of the optical structure element, wherein the positions of the adjusting channels are described in details in the above four preferred embodiments and their alternative modes.

In the step of S1405, fixing channels can be provided in the optical structure element for permanently fixing the adjustable lens element in position, or the adjusting channel can be used to permanently fix the adjustable lens element in position. In other words, the adjusting channel and the fixing channel can be the same channel or different channels. The adhesive element used to permanently fix the adjustable lens element can be applied to top surface or a side surface of the adjustable lens element through the fixing channel and/or adjusting channel, wherein the detailed structures are described in the above four preferred embodiments and their alternative modes.

Figure 11:
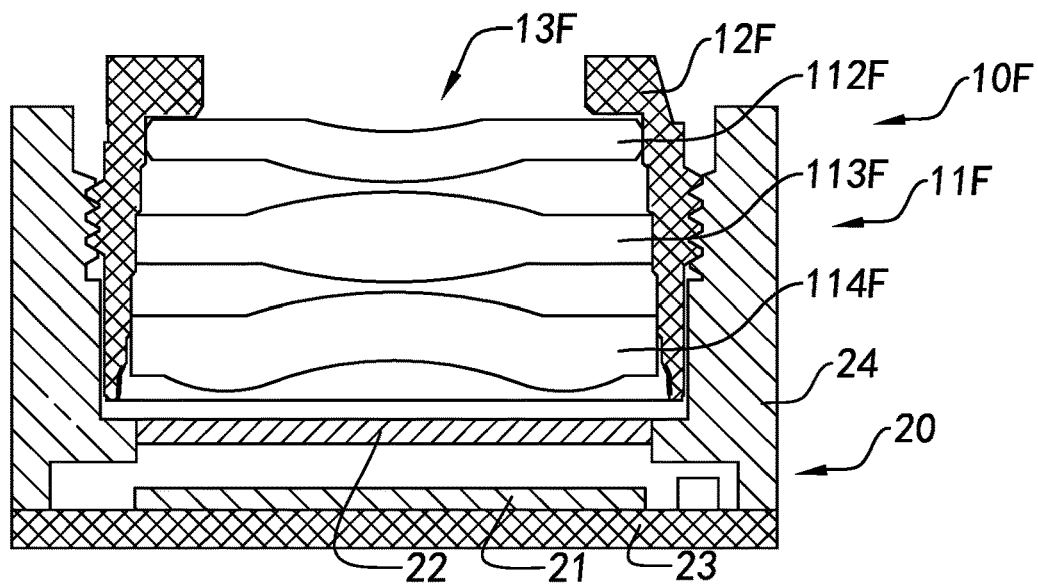
FIGS. 11 to 13 are sectional views illustrating an assembling process of a camera module according to a fifth preferred embodiment of the present invention.
Figure 12:
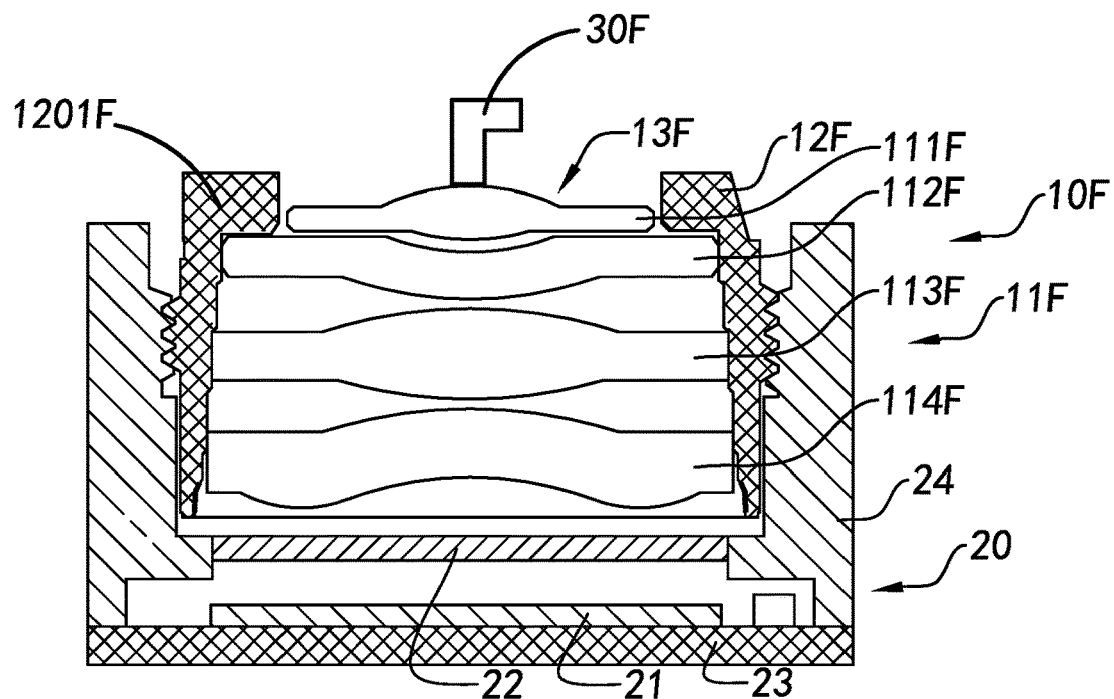
Figure 13:
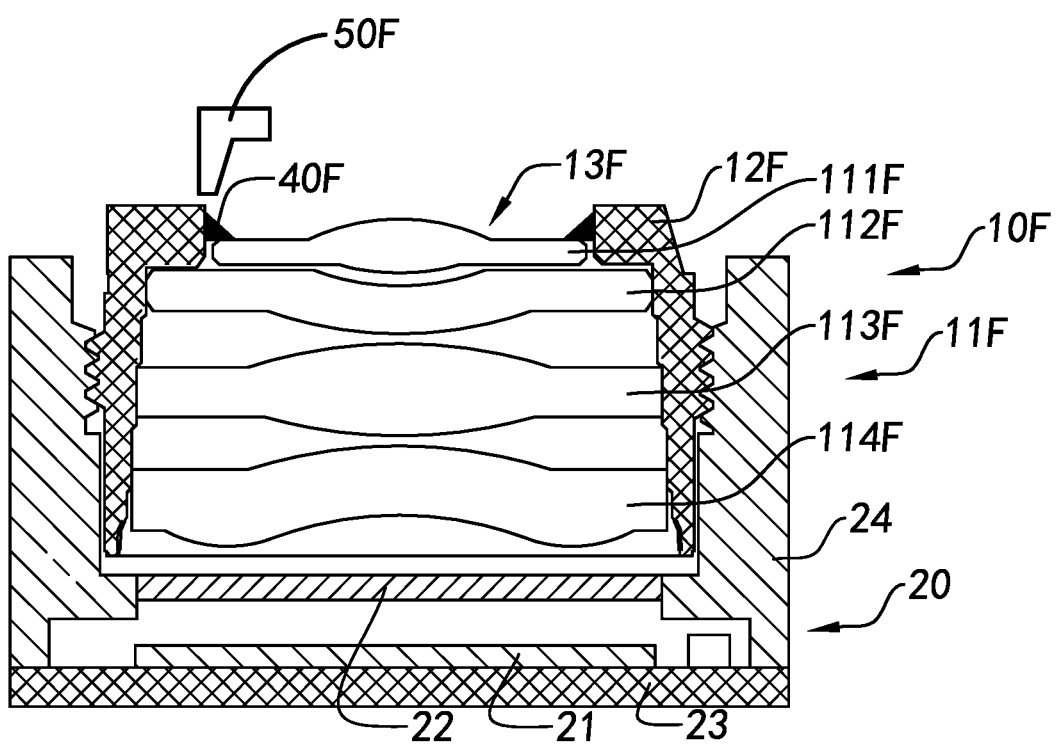

Referring to FIGS. 11, 12, 13 and 15, an aligning method according to fifth preferred embodiment of the present invention is illustrated. As shown in FIGS. 11 to 13 of the drawings, the camera module comprises an adjustable optical lens 10F and a photosensitive apparatus 20, wherein the photosensitive apparatus 20 can be constructed to have the same structure as the photosensitive apparatus 20 described in the above first preferred embodiment. The adjustable optical lens 10F is provided in an optical path of the photosensitive apparatus 20, so that the camera module is able to shoot pictures and provide images.

The adjustable optical lens 10F is configured to comprise one or more lens elements 11F and an optical structure element 12F, wherein each of the lens elements 11F is arranged in the optical structure element 12F along a height thereof in an optical path of an optical sensor 21 of the photosensitive apparatus 20.

The set of lens elements 11F according to this preferred embodiment includes four lens elements, i.e. a first lens element 111F, a second lens element 112F, a third lens element 113F, and a fourth lens element 114F. The four lens elements 111F, 112F, 113F, and 114F are installed in the optical structure element 12F from a top portion to a bottom portion thereof. The first lens element 111F is provided at the top portion 1201F of the optical structure element 12F, and is pre-assembled in the optical structure element 12F to arrange and function as an adjustable lens element 111F which is arranged to be adjusted along at least one direction, that is an optical length of the adjustable optical lens 10F is adjustable, so that a central axis of the adjustable optical lens 10F can be overlappingly aligned with a central axis of the optical sensor 21, or within an allowable range of a deviance thereof.

After the adjusting process, the first lens element 111F is permanently fixed in position within the optical structure element 12F to finish the assembly of the adjustable optical lens 10F.

Figure 15:
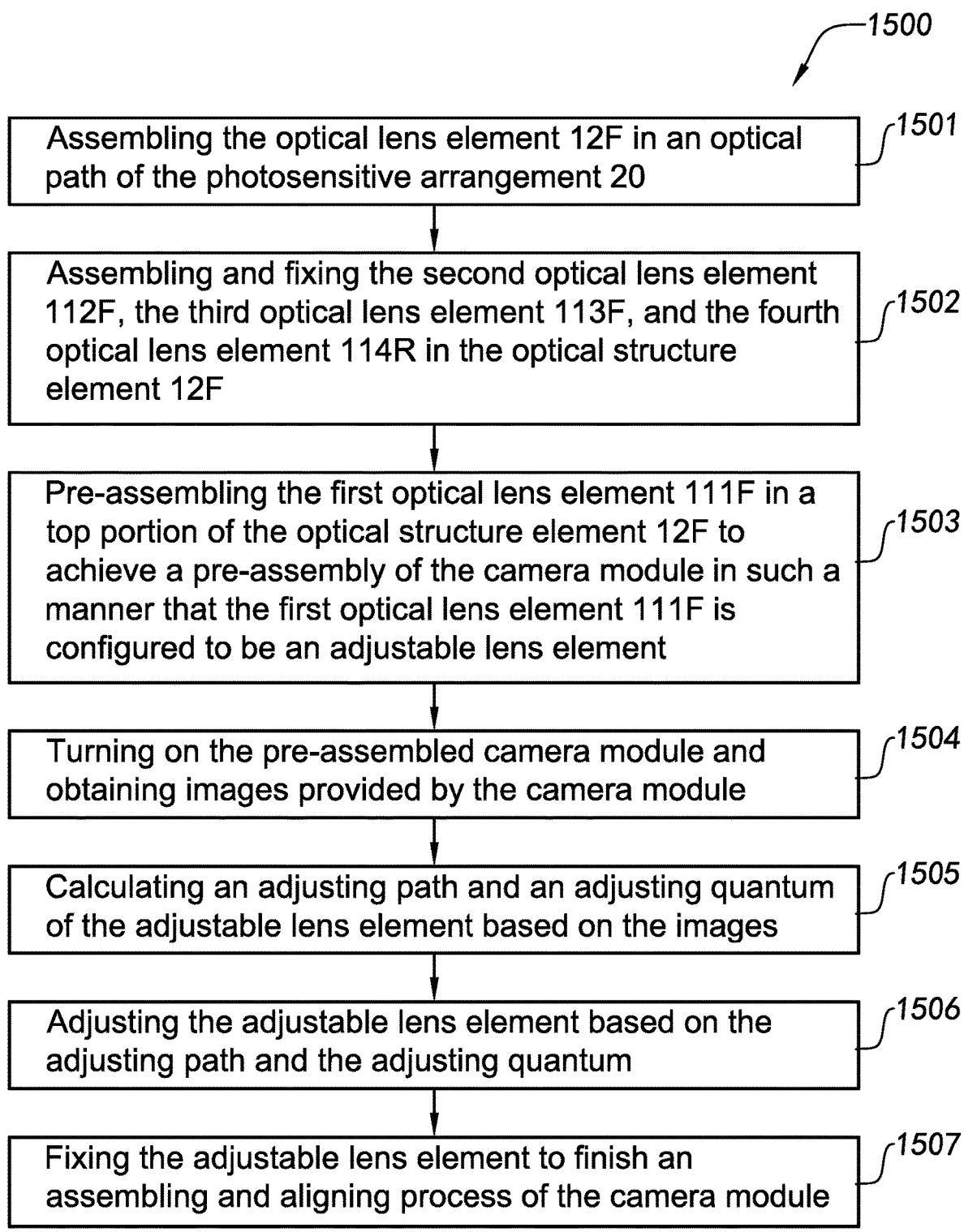
FIG. 15 is a flow chart illustrating the aligning method of the camera module according to the above fifth preferred embodiment of the present invention.

Referring to FIG. 15, the aligning method 1500 of the camera module comprises the following steps.

S1501: Assembling the lens element 12F along an optical path of the photosensitive apparatus 20.

S1502: Assembling and permanently fixing the second lens element 112F, the third lens element 113F, and the fourth lens element 114R in position within the optical structure element 12F.

S1503: Pre-assembling the first lens element 111F at a top portion of the optical structure element 12F to form a pre-assembled camera module in such a manner that the first lens element 111F is configured to be an adjustable lens element.

S1504: Electrifying the pre-assembled camera module and obtaining images produced by the camera module.

S1505: Computing an adjusting path and an adjusting quantum of the adjustable lens element based on the images obtained.

S1506: Adjusting the adjustable lens element based on the adjusting path and the adjusting quantum.

S1507: Permanently fixing the adjustable lens element in position within the optical structure element to complete an assembling and aligning process for calibration of the camera module.

Accordingly, in the step of S1502, the second lens element 112F, the third lens element 113F, and the fourth lens element 114F can be successively assembled in the optical structure element 12F one by one, or the three lens elements 112F, 113F and 114F are assembled as an integral structure, and then the integral structure is installed in the optical structure element 12F.

In the step S1503, the first lens element 111F is placed above the photosensitive apparatus at the top portion of the optical structure element 12F at a position above the second lens element 11F, and that the first lens element 111F is pre-assembled to be configured as the adjustable lens element for adjusting its assemble position with respect to the optical structure element in the subsequent procedure. The adjustment of the adjustable lens element can be simply operated at the top portion of the optical structure element 12F, where no special adjusting channel is provided, for ease of the operation.

In the step of S1506, since the first lens element 111F is placed above the photosensitive apparatus at the top portion of the optical structure element 12F, the adjustable lens element is accessible and adjustable through a light incident channel 13F provided at the top portion of the optical structure element 12F. When adjusting the adjustable lens element, a tool 30F may be inserted into the optical structure element 12F through the top portion of the optical structure element 12F to reach and contact the respective adjustable lens element, and then with an aid of mechanical operation, or vacuum suction, the adjustment of the adjustable lens element can be carried out.

In the step of S1507, after the adjusting process, an adhesive element 40F, which can be thermosetting adhesive, is filled through the light incident channel 13F at the top portion of the optical structure element 12F, for example, through, an adhesive applying tool 50F. After the adhesive element 40F is solidified, the first lens element 111F is permanently fixed in position while no special fixing channel is required, resulting in a more simple structure according to this embodiment. For example, the adhesive element can be applied to an edge of the adjustable lens element, and then after a solidifying process, the adjustable lens element will be permanently fixed in position within the optical structure element 12F.

It is worth mentioning that the adjustable lens element also can be placed at the optical structure element and a carrier portion can be provided at the optical structure element to pre-assemble the adjustable lens element. Alternatively, a semi-curing adhesive element can be used to pre-assemble the adjustable lens element, so as to prevent a relatively large deviance of the adjustable lens element, and facilitate a subsequent adjusting process, so as to reduce the adjustment range, reduce adjustment times, and increase the aligning efficiency.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
an optical sensor, and
an adjustable optical lens, which is optically coupled with said optical sensor, comprising two or more lens elements and an optical structure element, wherein said lens elements are spacedly arranged in order along an optical path of said optical sensor within said optical structure element, wherein at least one of said lens elements is configured as an adjustable lens element that an assemble position thereof is arranged to be adjustable along multiple directions selected from the group consisting of a horizontal direction, a vertical direction, an incline direction, and a peripheral direction to adjust relative positions between said adjustable lens element and other lens elements as well as a relative position between said adjustable lens element and said optical sensor before permanently affixed to said optical structure element, wherein one or more channels are provided in said optical structure element and positioned with respect to said adjustable lens element and reach an outer side surface of said optical structure element to communicate an interior space of said optical structure element with an outside environment thereof for adjusting and permanently fixing said adjustable lens element in position within said optical structure element;
wherein one or more of the one or more channels functions as an adjusting channel for adjusting said adjustable lens element within said optical structure element and reaches an outer top surface of said optical structure element to communicate an interior space of said optical structure element with an outside environment thereof, and an adjusting path and an adjusting quantum of the adjustable lens element is obtained by pre-assembling the camera module, electrifying the pre-assembled camera module, and obtaining one or more images captured by the pre-assembled camera module and analyzing the images;
wherein another one or more of the one or more channels functions as a fixing channel for permanently fixing said adjustable lens element in position within said optical structure element and
wherein positions of the adjusting channel and the fixing channel are different.

2. The camera module, as recited in claim 1, wherein said optical structure element has a top portion and one of said lens elements is installed at said top portion of said optical structure element and arranged to be adjustable as said adjustable lens element.

3. The camera module, as recited in claim 1, wherein said optical structure element has a middle portion and one or more said lens elements are installed at said middle portion of said optical structure element and each of which is arranged to be adjustable as said adjustable lens element.

4. The camera module, as recited in claim 2, wherein said one or more channel is provided at a top side of said optical structure element.

5. The camera module, as recited in claim 2, wherein said adjusting channel and said fixing channel are provided at a top side of said optical structure element.

6. The camera module, as recited in claim 2, wherein said one or more channels is provided at a lateral side and a top side of said optical structure element.

7. The camera module, as recited in claim 2, wherein said fixing channel is provided at a top side of said optical structure element.

8. The camera module, as recited in claim 2, wherein said fixing channel is provided at a lateral side of said optical structure element.

9. The camera module, as recited in claim 1, wherein said one or more channels is arranged to enable an external adjusting tool inserting into said adjusting channel to reach and contact said adjustable lens element to adjust said assemble position of said adjustable lens element which is capable of being adjusted along at least one direction, so as to align and calibrate a light path of said adjustable optical lens.

10. The camera module, as recited in claim 9, wherein said external adjusting tool has an automatic function that is to automatically compute the adjusting path and the adjusting quantum of said adjustable lens element.

11. The camera module, as recited in claim 9, wherein said fixing channel is arranged to enable applying an adhesive element to a portion of said adjustable lens element therethrough, and that after said adhesive element is solidified, said adjusted adjustable lens element is permanently fixed in position within said optical structure element.

12. The camera module, as recited in claim 11, wherein said adjustable lens element has a top surface adapted for said adhesive element to be applied thereon to permanently fix said adjustable lens element in position within said optical structure element.

13. The camera module, as recited in claim 11, wherein said adjustable lens element has a side surface adapted for said adhesive to be applied thereon to permanently fix said adjustable lens element in position within said optical structure element.

14. The camera module, as recited in claim 1, wherein said adjustable lens element has at least one adjusting groove provided at an edge thereof in such a manner that an external adjusting tool is capable of inserting into said optical structure element and being retained at said adjusting groove to adjust said assemble position of said adjustable lens element.

* * * * *